United States Patent
Wu

(10) Patent No.: US 7,719,357 B2
(45) Date of Patent: May 18, 2010

(54) DIFFERENTIAL AMPLIFIER WITH A PLURALITY OF INPUT PAIRS

(75) Inventor: Shang-Hsiu Wu, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 366 days.

(21) Appl. No.: 11/692,206

(22) Filed: Mar. 28, 2007

(65) Prior Publication Data

US 2008/0150636 A1 Jun. 26, 2008

(30) Foreign Application Priority Data

Dec. 21, 2006 (TW) .............................. 95148182 A

(51) Int. Cl.
*H03F 3/68* (2006.01)

(52) U.S. Cl. ................... 330/252; 330/295; 330/124 D; 330/124 R

(58) Field of Classification Search ................. 330/252, 330/254, 295, 124 D, 124 R
See application file for complete search history.

*Primary Examiner*—Michael B Shingleton
(74) *Attorney, Agent, or Firm*—Jianq Chyun IP Office

(57) ABSTRACT

The present invention provides a differential amplifier with a plurality of input pairs. The differential amplifier not only includes a differential amplifier with a single input pair but also includes a pair of transistors and a current source to provide the input signals of an extra input pair. The pair of transistors and the differential amplifier with a single input pair share a same load unit. In addition, by using control signals to control the on/off state of each current source, the input signals of the plurality of input pairs are switched, and thereby improve the signal quality. Thus, the need of an additional electrostatic discharge device (ESD device) may be avoided, and thereby reduce cost.

10 Claims, 15 Drawing Sheets

US 7,719,357 B2

DIFFERENTIAL AMPLIFIER WITH A PLURALITY OF INPUT PAIRS

CROSS-REFERENCE TO RELATED APPLICATION

This application claims the priority benefit of Taiwan application serial no. 95148182, filed Dec. 21, 2006. All disclosure of the Taiwan application is incorporated herein by reference.

BACKGROUND OF THE INVENTION

1. Field of the Invention

The present invention generally relates to a differential amplifier, and more particular, to a differential amplifier with a plurality of input pairs.

2. Description of Related Art

Along with the prosperous progress of electronics, a differential amplifier has being broadly used in various circuit designs. A typical differential amplifier comprises two input terminals, and the output signal thereof is the difference between two voltages at the two input terminals multiplied by the gain of the amplifier. In order to switch different input signals, a conventional differential amplifier employs switches at the input terminals thereof to accomplish the switch operations.

FIG. 1 is a circuit diagram of a conventional differential amplifier to switch two input pairs. Referring to FIG. 1, the differential amplifier includes a load unit 101, a load unit 103, two transistors 105 and 107, a current source 109 and switches 111, 113, 115 and 117. The operation voltage and the grounded terminal herein are respectively represented by VDD and GND. As the switch 111 is turned on, an input signal INA1 of a first input pair is conducted to the gate terminal of the transistor 105; as the switch 113 is turned on, an input signal INB1 of the first input pair is conducted to the gate terminal of the transistor 107. Thus, as the switches 111 and 113 are simultaneously turned on, the differential amplifier would receive the input signals of the first input pair.

Similarly, as the switch 115 is turned on, an input signal INA2 of a second input pair is conducted to the gate terminal of the transistor 105; as the switch 117 is turned on, an input signal INB2 of the second input pair is conducted to the gate terminal of the transistor 107. Thus, as the switches 115 and 117 are simultaneously turned on, the differential amplifier would receive the input signals of the second input pair. It can be seen that in the prior art, the input signals of a plurality of input pairs are switched by using a plurality of switches disposed at the gate terminals of the transistors 105 and 107.

FIG. 2 is a circuit diagram of another conventional differential amplifier to switch two input pairs. Referring to FIG. 2, the differential amplifier includes a load unit 101, a load unit 103, two transistors 105 and 107, a current source 109, a load unit 201, a load unit 203, two transistors 205 and 207, a current source 209 and switches 211, 213, 215 and 217. It can be seen from FIG. 2 that the prior art employs an additional differential amplifier to provide another set of input signals incorporated with four switches to achieve the switching operations of a plurality of input pairs. In other words, as the switches 211 and 213 are turned on, the output signals OUTA and OUTB are provided by the input signals INA1 and INB1 of the first input pair; as the switches 215 and 217 are turned on, the output signals OUTA and OUTB are provided by the input signals INA2 and INB2 of the second input pair. It can be seen that in the prior art, the input signals of a plurality of input pairs are switched by disposing additional differential amplifiers and using a plurality of switches disposed at the output terminals thereof.

The differential amplifiers shown by FIGS. 1 and 2 have a common disadvantage that the turn-on impedance of the switches is too high, which would largely affect the quality of high-frequency signals. In order to lower the turn-on impedance, the switch area must be substantially increased. In addition, the switches 211, 213, 215 and 217 must be disposed at the output nodes as shown by FIG. 2, but in fact, the two differential amplifiers may be located quite far from each other and long signal lines may needed to connect the two sets of output signals to the switches. Thus, the long signal lines may become one of electromagnetic interference sources and lead to poor signal quality. Furthermore, considering that in the prior art, metal oxide semiconductor transistors (MOS transistors) are popularly used as switches, for example, as shown in FIG. 1, four switches are disposed at the input signal terminals of the differential amplifier. Thus, additional electrostatic discharge devices (ESD device) are required, which are a considerable waste of space and cost. In FIG. 2, although the additional ESD device is saved, but an additional differential amplifier is required, wherein in particular, a load unit is employed, which leads a significant increase in cost.

Accordingly, manufacturers are eager to seek a proper solution to overcome the above-mentioned problems.

SUMMARY OF THE INVENTION

The present invention is directed to a differential amplifier with a plurality of input pairs, which switches the input signals of the plurality of input pairs according to control signals.

The present invention is also directed to a differential amplifier with a plurality of dual input pairs, which switches the input signals of different dual input pairs by controlling the on/off state of current sources according to control signals.

The present invention provides a differential amplifier with a plurality of input pairs, which includes a first load unit, a second load unit, a first transistor, a second transistor, a first current source, a third transistor, a fourth transistor and a second current source. The first load unit herein has a first terminal and a second terminal. The first terminal of the first load unit is coupled to a first voltage. The second load unit has a first terminal and a second terminal. The first terminal of the second load unit is coupled to a second voltage. The first transistor has a gate, a first source/drain and a second source/drain. The gate of the first transistor is coupled to a first voltage bias of a first input pair and the first source/drain of the first transistor is coupled to the second terminal of the first load unit. The second transistor has a gate, a first source/drain and a second source/drain. The gate of the second transistor is coupled to a second voltage bias of the first input pair and the first source/drain of the second transistor is coupled to the second terminal of the second load unit. The first current source has a first terminal and a second terminal. The first terminal of the first current source is coupled to the second source/drain of the first transistor and the second source/drain of the second transistor and the second terminal of the first current source is coupled to a third voltage. The third transistor has a gate, a first source/drain and a second source/drain. The gate of the third transistor is coupled to a first voltage bias of a second input pair and the first source/drain of the third transistor is coupled to the second terminal of the first load unit. The fourth transistor has a gate, a first source/drain and a second source/drain. The gate of the fourth transistor is coupled to a second voltage bias of the second input pair and the first source/drain of the fourth transistor is coupled to the second terminal of the second load unit. The second current source has a first terminal and a second terminal. The first terminal of the second current source is coupled to the second source/drain of the third transistor and the second source/drain of the fourth transistor, and the second terminal of the second current source is coupled to a fourth voltage. The differential amplifier determines the on/off state of the first current source according to a first control signal and determines the on/off state of the second current source according to a second control signal, wherein the input pairs are switched by turning on the first current source or the second current source.

According to an embodiment of the present invention, the above-mentioned first transistor of the differential amplifier is an NMOS transistor, the second transistor is an NMOS transistor, the third transistor is an NMOS transistor and the fourth transistor is an NMOS transistor. The first load unit further includes a third current source, a first PMOS transistor and a third load unit, wherein the third current source has a first terminal and a second terminal, the first terminal of the third current source is coupled to the first voltage; the gate terminal of the first PMOS transistor is coupled to a first operation voltage bias and the source terminal of the first PMOS transistor is coupled to the second terminal of the third current source; the third load unit has a first terminal and a second terminal, the first terminal of the third load unit is coupled to the drain terminal of the first PMOS transistor and the second terminal of the third load unit is coupled to a fifth voltage. The first terminal of the third current source serves as the first terminal of the first load unit, and the second terminal of the third current source serves as the second terminal of the first load unit. The second load unit further includes a fourth current source, a second PMOS transistor and a fourth load unit, wherein the fourth current source has a first terminal and a second terminal, the first terminal of the fourth current source is coupled to the second voltage; the gate terminal of the second PMOS transistor is coupled to a second operation voltage bias and the source terminal of the second PMOS transistor is coupled to the second terminal of the fourth current source; the fourth load unit has a first terminal and a second terminal, the first terminal of the fourth load unit is coupled to the drain terminal of the second PMOS transistor and the second terminal of the fourth load unit is coupled to a sixth voltage. The first terminal of the fourth current source serves as the first terminal of the second load unit, while the second terminal of the fourth current source serves as the second terminal of the second load unit. The first terminal of the fourth load unit serves as the first output terminal of the differential amplifier, and the first terminal of the third load unit serves as the second output terminal of the differential amplifier. In this way, a folded cascade differential amplifier is formed.

According to an embodiment of the present invention, the above-mentioned first transistor of the differential amplifier is a PMOS transistor, the second transistor is a PMOS transistor, the third transistor is a PMOS transistor and the fourth transistor is a PMOS transistor. The first load unit further includes a third current source, a first NMOS transistor and a third load unit, wherein the third current source has a first terminal and a second terminal, the first terminal of the third current source is coupled to the first voltage; the gate terminal of the first NMOS transistor is coupled to a first operation voltage bias and the source terminal of the first NMOS transistor is coupled to the second terminal of the third current source; the third load unit has a first terminal and a second terminal, the first terminal of the third load unit is coupled to the drain terminal of the first NMOS transistor and the second terminal of the third load unit is coupled to a fifth voltage. The first terminal of the third current source serves as the first terminal of the first load unit, and the second terminal of the third current source serves as the second terminal of the first load unit. The second load unit further includes a fourth current source, a second NMOS transistor and a fourth load unit, wherein the fourth current source has a first terminal and a second terminal. The first terminal of the fourth current source is coupled to the second voltage; the gate terminal of the second NMOS transistor is coupled to a second operation voltage bias, the source terminal of the second NMOS transistor is coupled to the second terminal of the fourth current source and the source terminal of the second NMOS transistor is the second terminal of the second load unit; the fourth load unit has a first terminal and a second terminal, the first terminal of the fourth load unit is coupled to the drain terminal of the second NMOS transistor and the second terminal of the fourth load unit is coupled to a sixth voltage. The first terminal of the fourth current source serves as the first terminal of the second load unit, and the second terminal of the fourth current source serves as the second terminal of the second load unit. The first terminal of the fourth load unit serves as the first output terminal of the differential amplifier, and the first terminal of the third load unit serves as the second output terminal of the differential amplifier. In this way, a folded cascade differential amplifier is formed.

In summary, since the present invention adopts a differential amplifier with a plurality of input pairs, wherein the input signals of the plurality of input pairs are switched by controlling on/off states of the current sources thereof, thus, an additional ESD device may not be required. In addition, the present invention requires comparatively less number of switches and thus reduce the cost and avoid the problem of poor signal quality caused by high-frequency switches. Compared to the prior art shown in FIG. 2, the present invention avoids usage of a load unit, which would further reduce the cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following embodiment depiction, 'a component is connected to or coupled to another component' means the component is directly or through a between component connected to or coupled to another component; on the other hand, 'a component is directly connected to or coupled to another component' means the component is directly connected to or directly coupled to another component without through a between component.

Figure 1:
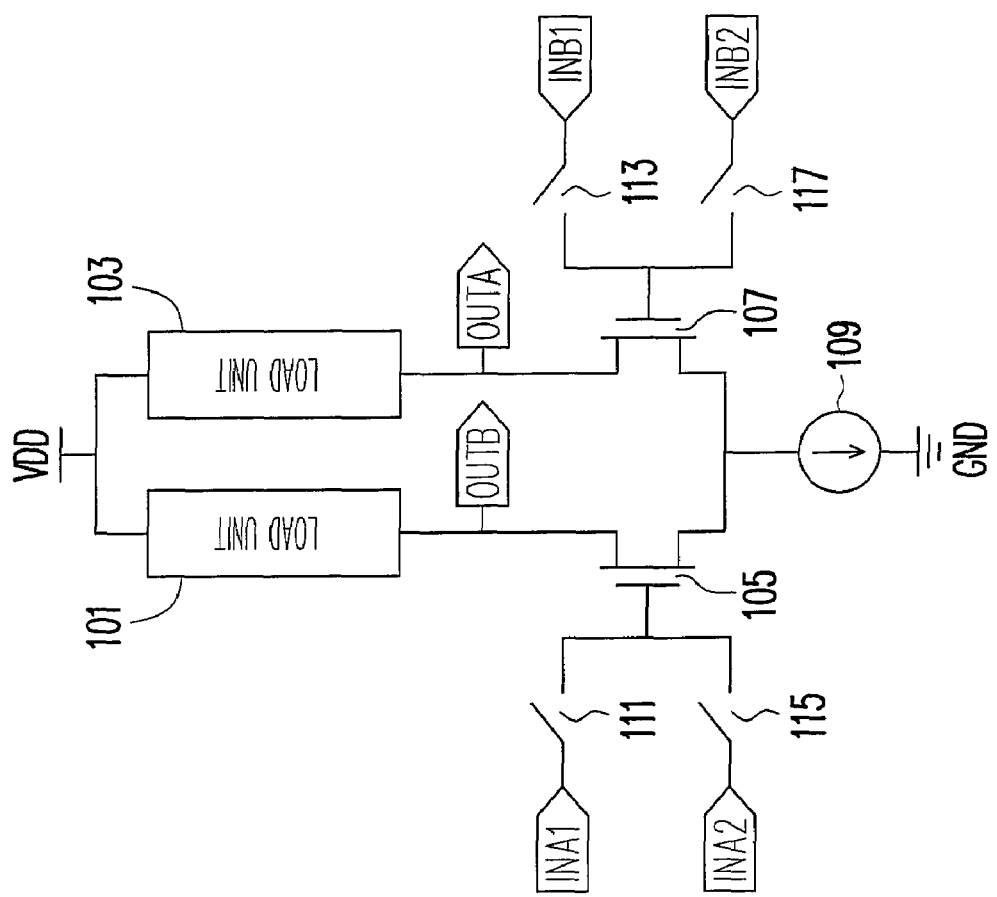
FIG. 1 is a circuit diagram of a conventional differential amplifier used for switching two input pairs.
Figure 2:
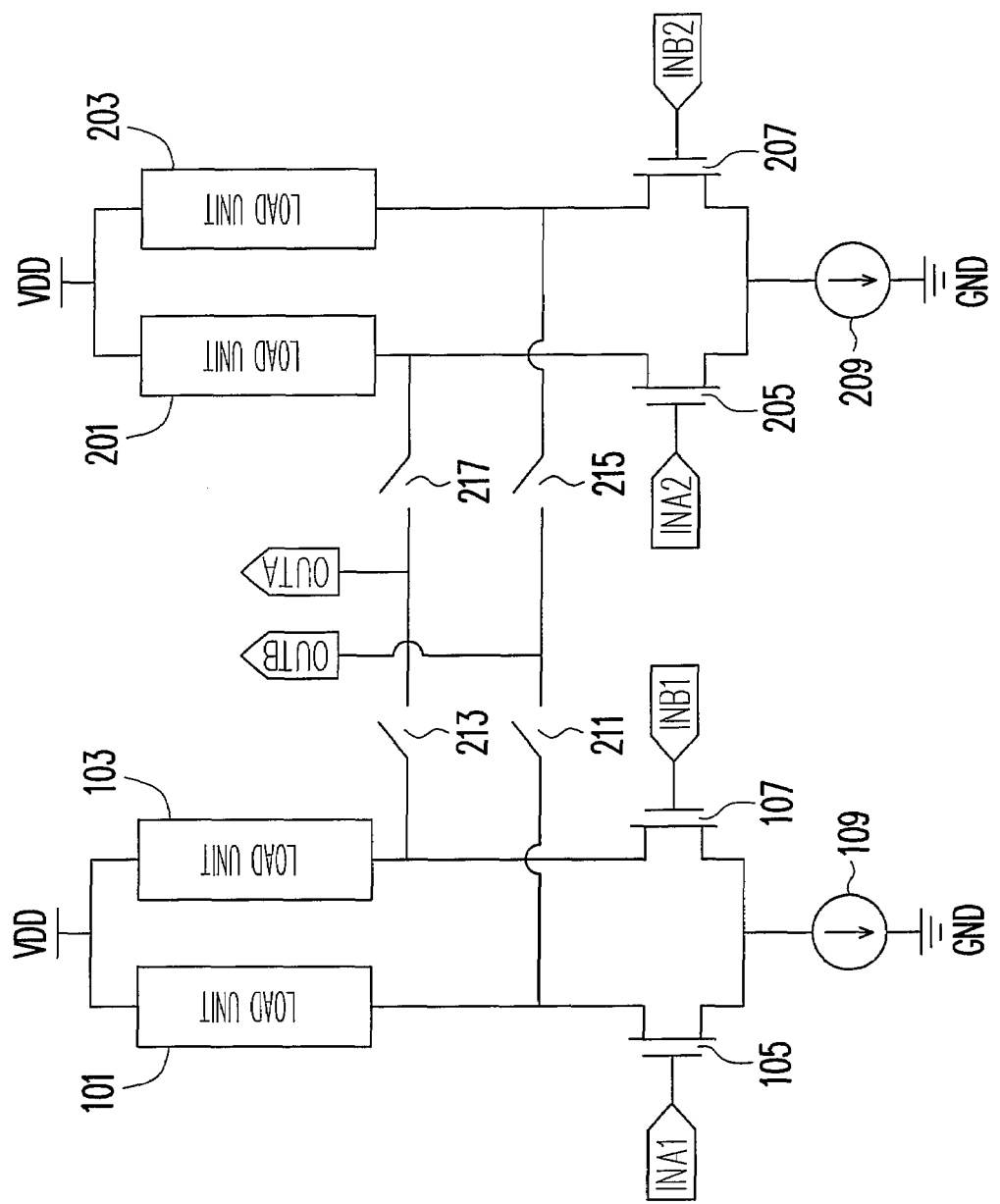
FIG. 2 is a circuit diagram of another conventional differential amplifier used for switching two input pairs.
Figure 3A:
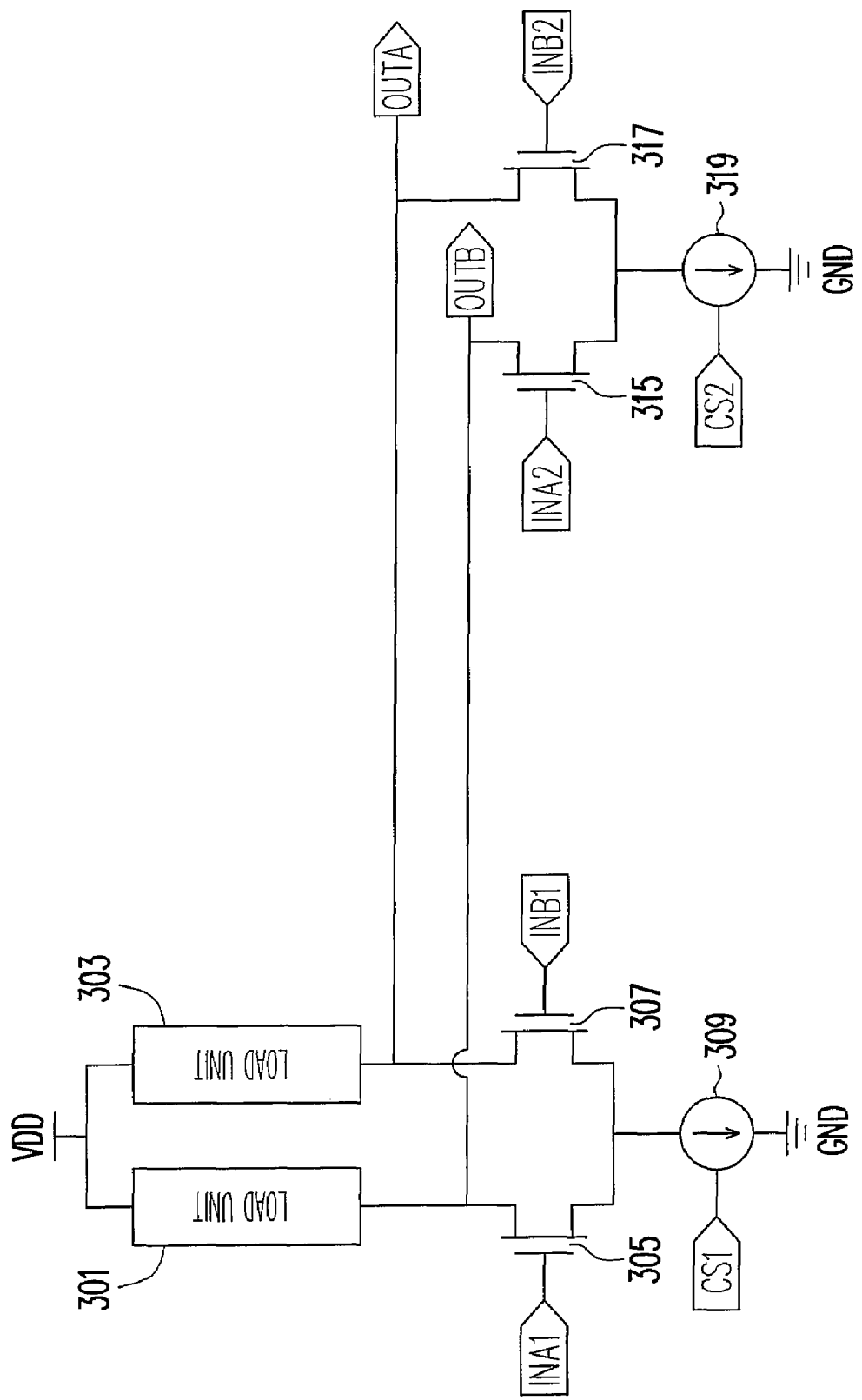
FIG. 3A is a circuit diagram of a differential amplifier with a plurality of input pairs according to an embodiment of the present invention.

FIG. 3A is a circuit diagram of a differential amplifier with a plurality of input pairs according to an embodiment of the present invention. Referring to FIG. 3A, the differential amplifier includes load units 301 and 303, NMOS transistors 305, 307, 315 and 317 and current sources 309 and 319. The operation voltage and the grounded terminal are respectively represented by VDD and GND. The gate terminals of the NMOS transistors 305 and 307 respectively receive the input signals INA1 and INB1 of the first input pair, and the gate terminals of the NMOS transistors 315 and 317 respectively receive the input signals INA2 and INB2 of the second input pair. The control signals CS1 and CS2 respectively control on/off state of the current sources 309 and 319. In other words, when the control signal CS1 turns on the current source 309 and the control signal CS2 turns off the current source 319, the NMOS transistors 315 and 317 are turned off and the equivalent circuit thereof is shown by FIG. 3B.

Figure 3B:
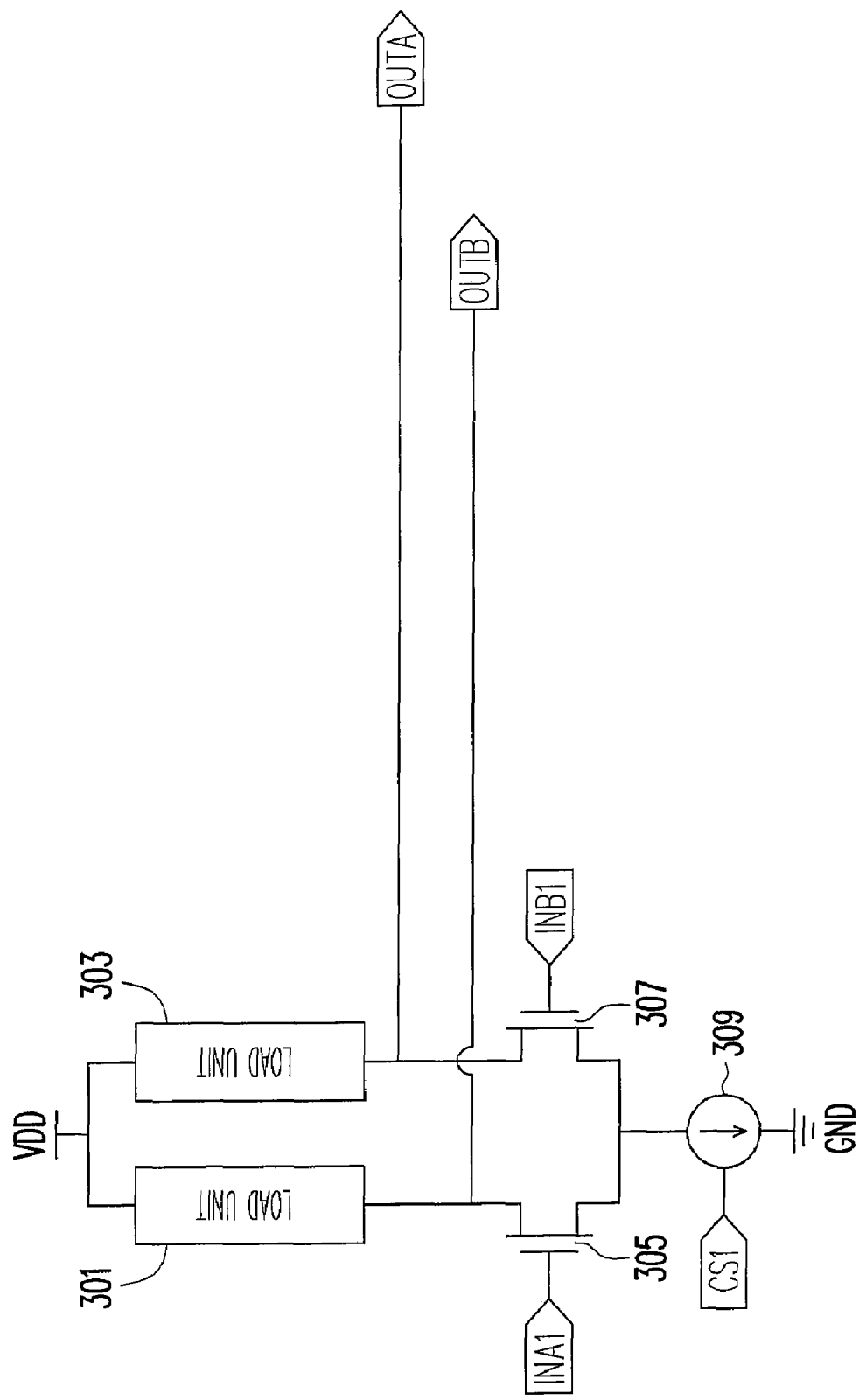
FIG. 3B is an equivalent circuit diagram of a differential amplifier with a plurality of input pairs according to an embodiment of the present invention.

FIG. 3B is an equivalent circuit diagram of a differential amplifier with a plurality of input pairs according to an embodiment of the present invention. Referring to FIG. 3B, considering the current source 309 is a constant current source, the sum of the currents flowing through the NMOS transistors 305 and 307 is equal to the current flowing through the current source 309. Hence, when the conduction current of the NMOS transistor 305 is increased, the conduction current of the NMOS transistor 307 would be decreased; when the conduction current of the NMOS transistor 307 is increased, the conduction current of the NMOS transistor 305 would be decreased. The currents flowing through the NMOS transistors 305 and 307 are controlled by means of the difference between the input signals INA1 and INB1 of the first input pair, and the signals OUTA and OUTB are output according to the conduction currents through the NMOS transistors 305 and 307.

Figure 3C:
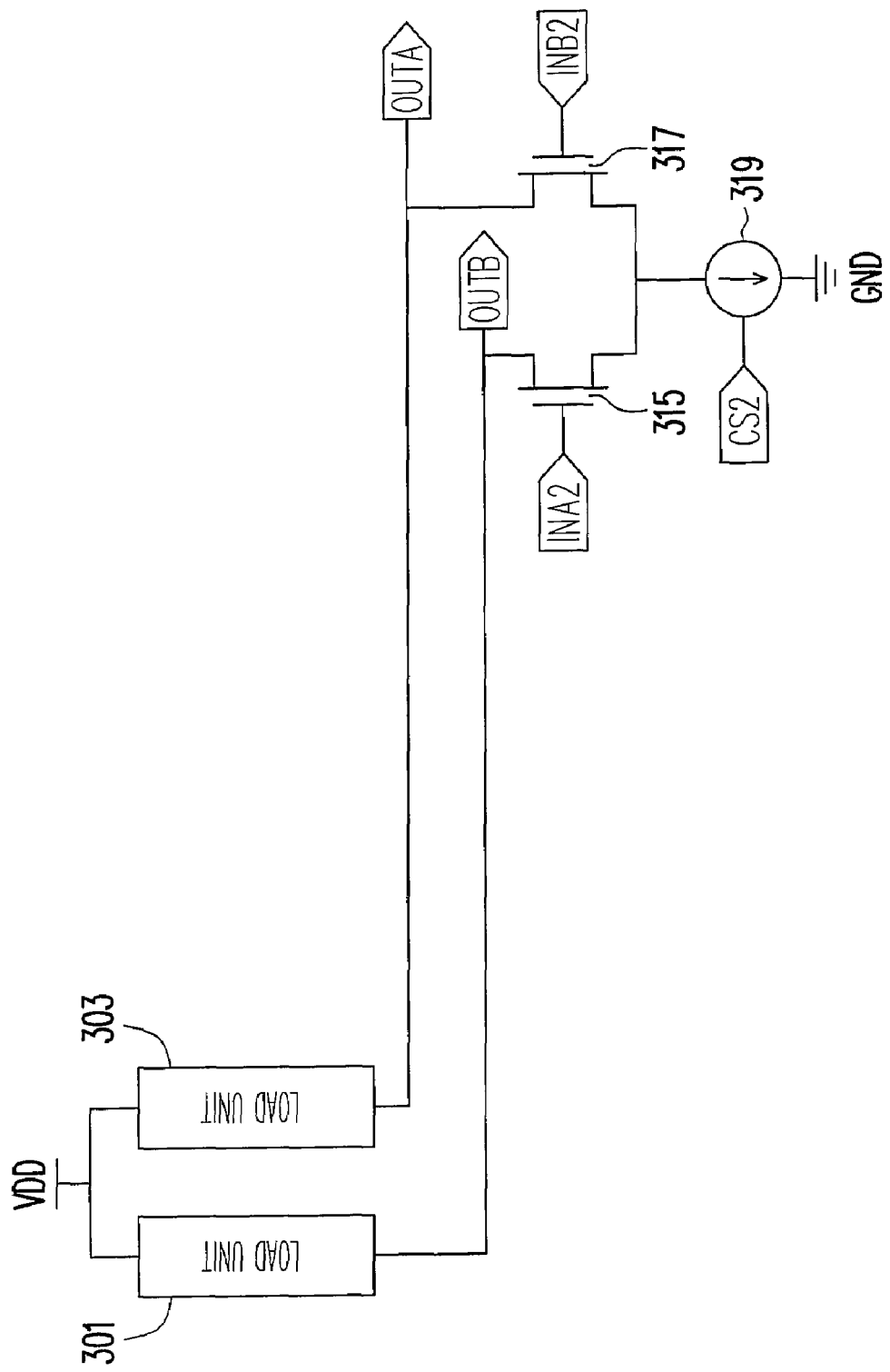
FIG. 3C is an equivalent circuit diagram of another differential amplifier with a plurality of input pairs according to an embodiment of the present invention.

FIG. 3C is an equivalent circuit diagram of another differential amplifier with a plurality of input pairs according to an embodiment of the present invention. When the control signal CS1 turns off the current source 309 and the control signal CS2 turns on the current source 319, no current flows through the NMOS transistors 305 and 307 and the equivalent circuit thereof is given by FIG. 3C. It should be noted that the input signals of the equivalent circuit at the point are changed to INA2 and INB2, the output signals OUTA and OUTB are accordingly varied with the input signals. In other words, the input signals of the differential amplifier can be switched between INA1/INB1 and INA2/INB2 by using the control signals CS1 and CS2 to respectively control the current sources 309 and 319.

Figure 3D:
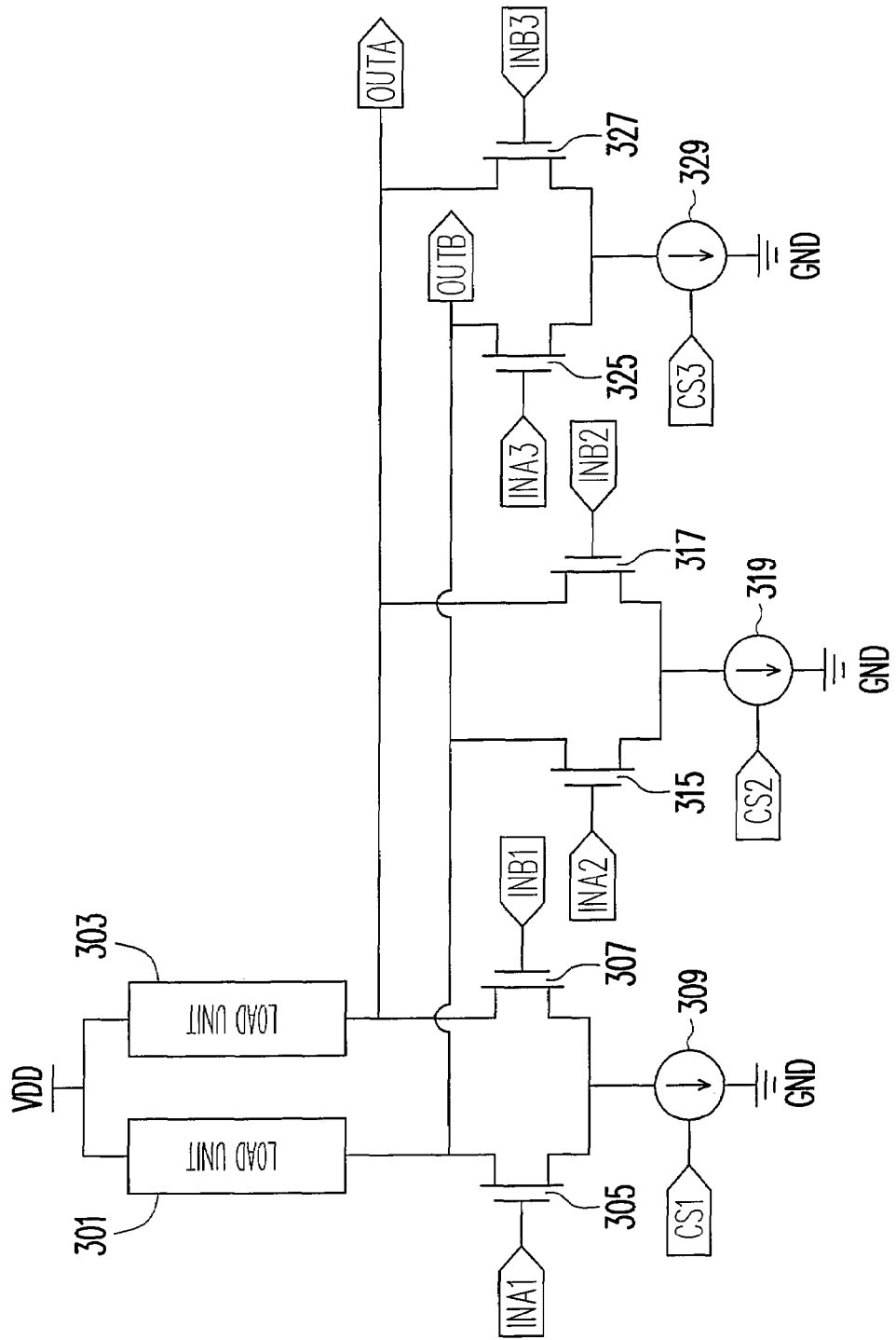
FIG. 3D is a circuit diagram of another differential amplifier with a plurality of input pairs according to an embodiment of the present invention.

FIG. 3D is a circuit diagram of another differential amplifier with a plurality of input pairs according to an embodiment of the present invention. Referring to FIG. 3D, additional NMOS transistors 325 and 327 and a current source 329 are included in the present embodiment. Three sets of the input signals herein can be switched by using the control signals CS1, CS2 and CS3 to respectively control on/off states of the current sources 309, 319 and 329. Anyone skilled in the art should be able to implement a differential amplifier capable of switching a plurality of input signal sets according to the above disclosure of the present invention without any difficulty.

Figure 4A:
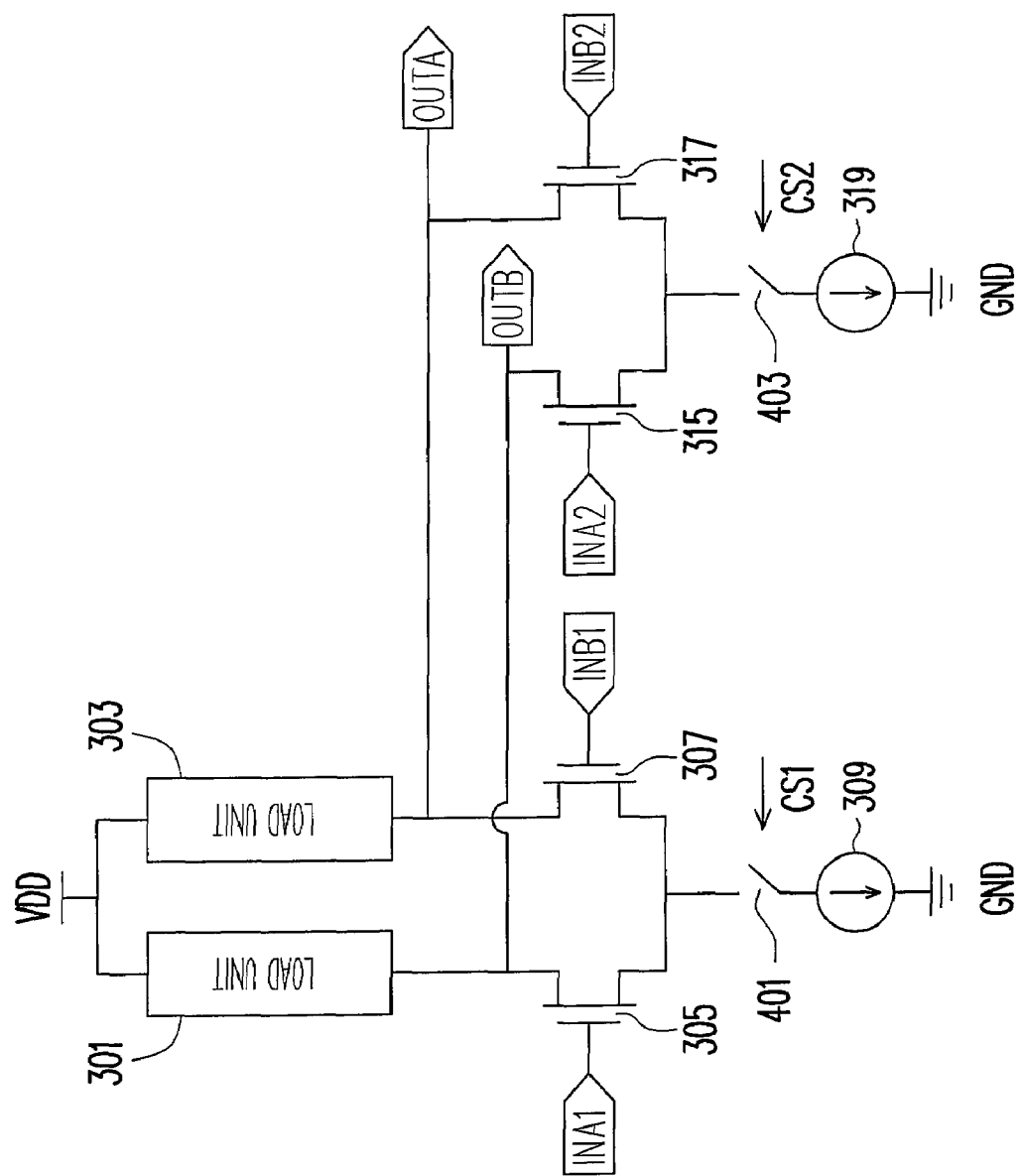
FIG. 4A is a circuit diagram of a differential amplifier where the switches are used to control the current sources according to an embodiment of the present invention.

FIG. 4A is a circuit diagram of a differential amplifier where the switches are used to control the current sources according to an embodiment of the present invention. Referring to FIG. 4A, the differential amplifier of the embodiment is similar to that shown by FIG. 3A except that in the embodiment a switch 401 is employed to turn on/off the current source 309 and further a control signal CS1 is used to control on/off states of the switch 401. When the switch 401 is turned off, no current flows through the current source 309, hence, the input signals INA1 and INB1 are considered as 'no presence'. Similarly, a switch 403 is employed to turn on/off the current source 319 and further a control signal CS2 is used to control on/off state of the switch 403. When the switch 403 is turned off, no current flows through the current source 319, hence, the input signals INA2 and INB2 are considered as 'no presence'. In other words, when the switch 401 is turned on and the switch 403 is turned off, the input signals of the differential amplifier are INA1 and INB1; when the switch 403 is turned on and the switch 401 is turned off, the input signals of the differential amplifier are INA2 and INB2. In this way, the input signals of the differential amplifier can be switched.

Figure 4B:
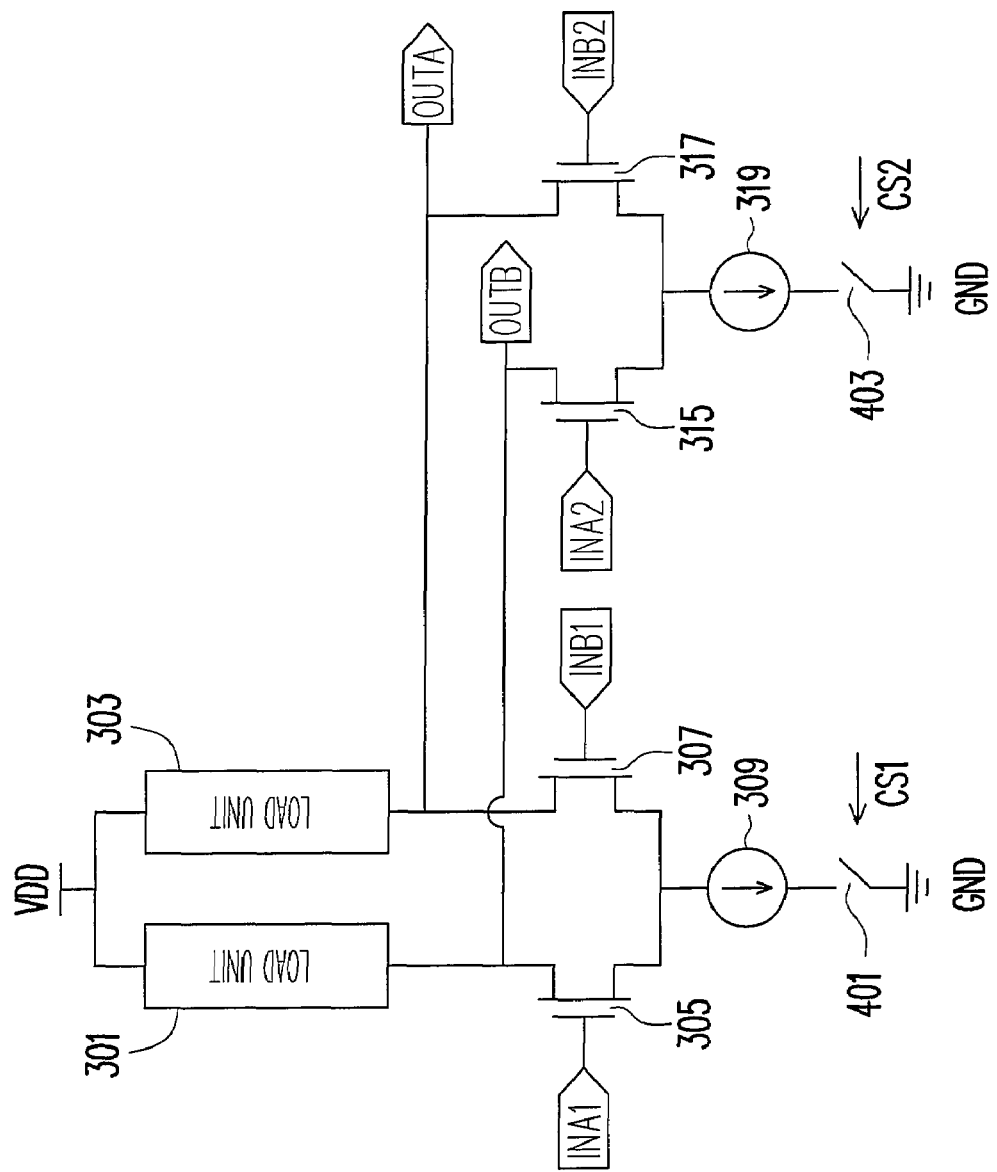
FIG. 4B is a circuit diagram of another differential amplifier where the switches are used to control the current sources according to an embodiment of the present invention.

FIG. 4B is a circuit diagram of another differential amplifier where the switches are used to control the current sources according to an embodiment of the present invention. Referring to FIG. 4B, although in the above-mentioned embodiment, the switch 401 is disposed between the NMOS transistors 305 and 307 and the current source 309, however, anyone skilled in the art can follow the principle of the above-mentioned embodiment and alternatively dispose the switch 401 between the current source 319 and the grounded terminal GND as well to control the on/off states of the current source 309. Besides, the switch 403 can be disposed between the current source 319 and the grounded terminal GND to achieve the same effect. It should be noted that the embodiment of the present invention has the following additional advantages. Since the switch is not disposed on a major current path of the input/output signals, interference on the signals would be less, and the benefit would be more noticeable with the high-frequency signal case even where no ESD device is needed. Compared to the prior art, although a set of transistors and current source is also employed, the number of a load units may be reduced, which would substantially reduce the cost.

Figure 5:
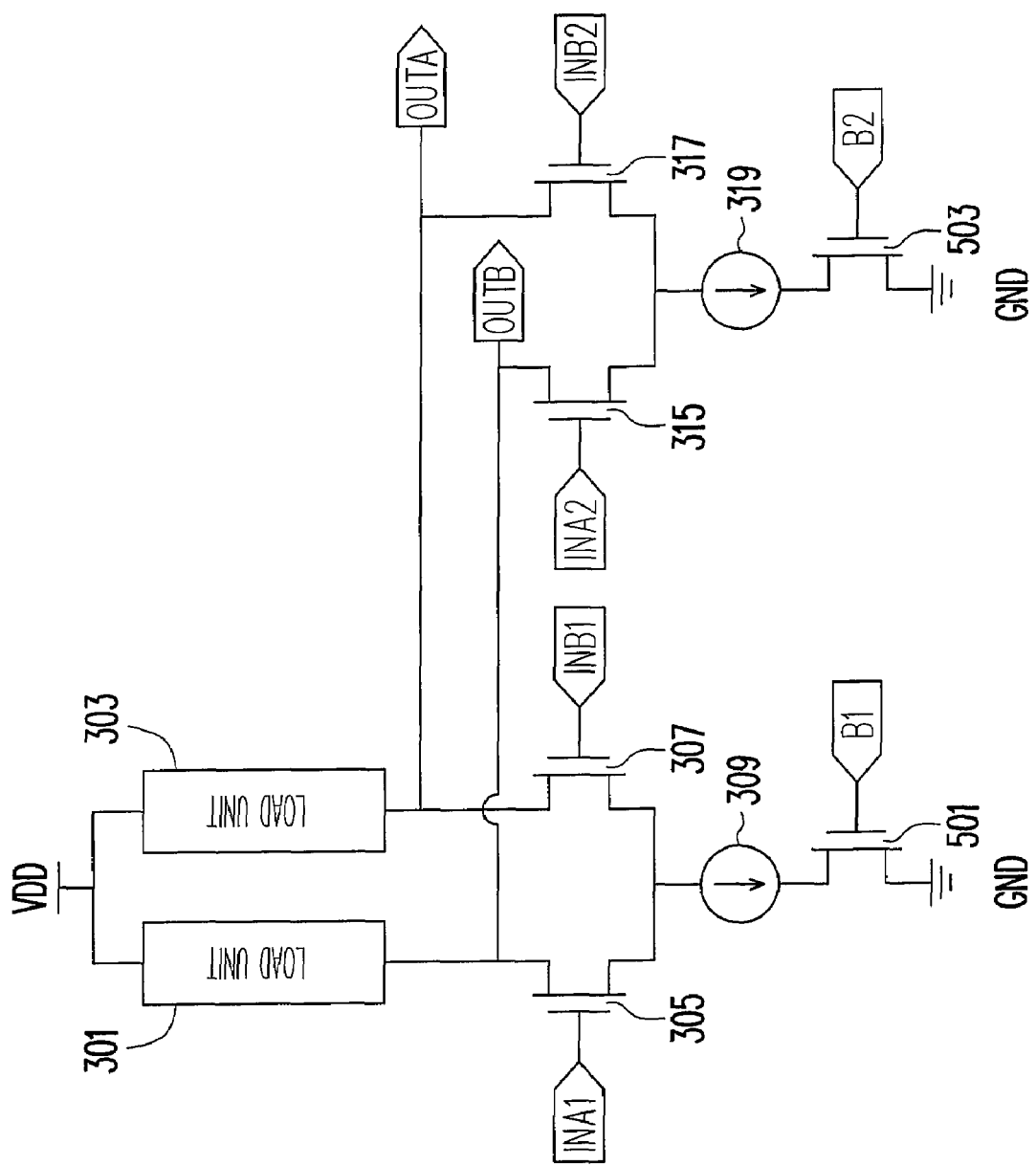
FIG. 5 is a circuit diagram of a differential amplifier where the switches are implemented by transistors according to an embodiment of the present invention.

The switches in the present embodiment can be replaced by any electronic components with switching function. FIG. 5 is a circuit diagram of a differential amplifier where the switches are implemented by transistors according to an embodiment of the present invention. Referring to FIG. 5, since the input voltage bias applied at the gate terminal of a transistor can be used to control the conduction current of the transistor, therefore, the transistor can be used as a switch. In the present embodiment, NMOS transistors 501 and 503 are used to implement the switches. An input voltage bias B1 applied at the NMOS transistor 501 controls on/off states of the current source 319. It should be noted that NMOS transistors are used in the present embodiment is for exemplary purpose only. Anyone skilled in the art would understand the NMOS transistor employed in the present embodiment is an example, the switch can be also implemented by a PMOS transistor, a bipolar transistor, a relay etc. In fact, the present invention does not limit to any specific electronic component to implement the switch.

Figure 6:
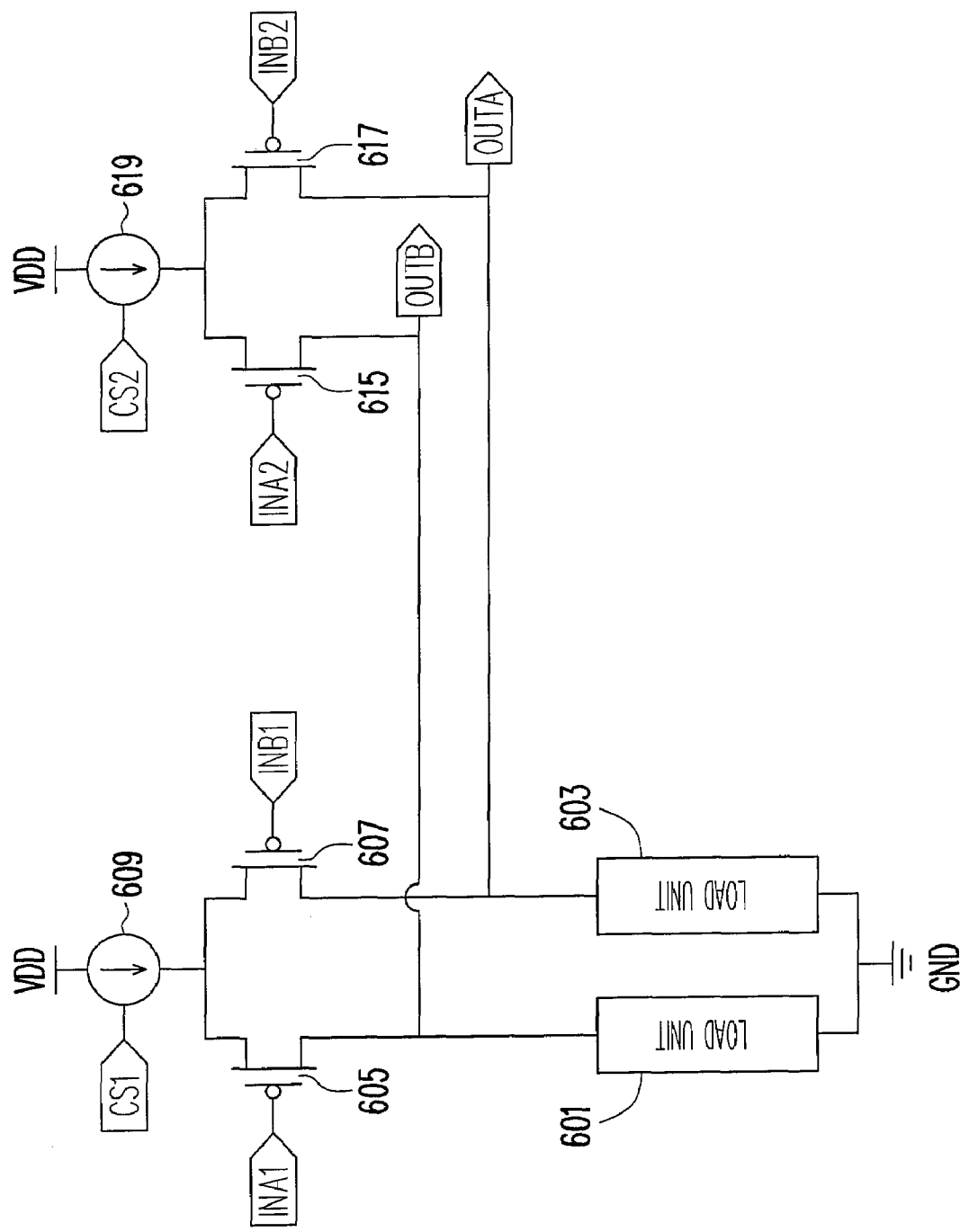
FIG. 6 is a circuit diagram of a differential amplifier with a plurality of input pairs where PMOS transistors are used as the input terminals thereof according to an embodiment of the present invention.

Although the above-mentioned embodiment employs NMOS transistors as the inputs terminals for a differential amplifier, while in another embodiment PMOS transistors incorporated with an appropriately adjusted circuit can be employed as the input terminals for a differential amplifier as well. FIG. 6 is a circuit diagram of a differential amplifier with a plurality of input pairs where PMOS transistors are used as the input terminals thereof according to an embodiment of the present invention. Referring to FIG. 6, the differential amplifier includes load units 601 and 603, PMOS transistors 605, 607, 615 and 617 and current sources 609 and 619. The operation voltage and the grounded terminal are respectively represented by VDD and GND. The gate terminals of the PMOS transistors 605 and 607 respectively receive the input signals INA1 and INB1 of the first input pair, and the gate terminals of the PMOS transistors 615 and 617 respectively receive the input signals INA2 and INB2 of the second input pair. The control signals CS1 and CS2 respectively control on/off state of the current sources 609 and 619 to switch the input signals of the differential amplifier. Anyone skilled in the art would be able to derive the application and the operation principle thereof according to the disclosure of the above embodiment, hence they are omitted.

Figure 7:
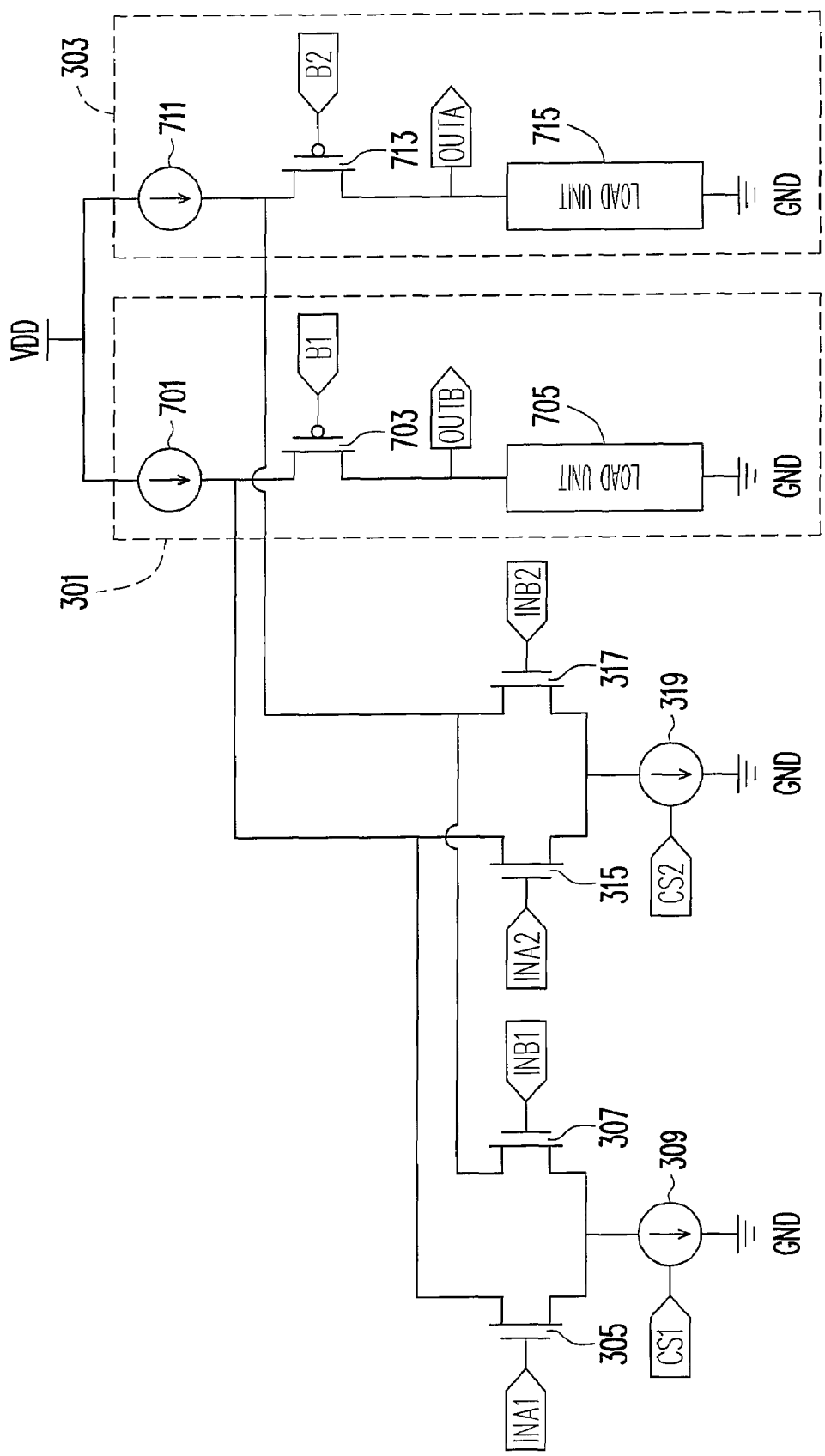
FIG. 7 is a circuit diagram of a folded cascade differential amplifier with a plurality of input pairs according to an embodiment of the present invention.

Anyone skilled in the art would be able to modify the implementation and appropriately adjust the circuit according to the present invention and the disclosure of the above embodiment. For example, FIG. 7 is a circuit diagram of a folded cascade differential amplifier with a plurality of input pairs according to an embodiment of the present invention. Referring to FIG. 7, the differential amplifier of the embodiment is similar to that shown by FIG. 3A except for a current source 701, a PMOS transistor 703 and a load unit 705 are employed to replace the load unit 301 of FIG. 3A in the above embodiment, and a current source 711, a PMOS transistor 713 and a load unit 715 are employed to replace the load unit 303 of FIG. 3A, wherein the gate terminals of the PMOS transistors 703 and 713 respectively receive an input voltage bias B1 and an input voltage bias B2, and the input voltage biases B1 and B2 serve as switches to control on/off states of the transistors. If the current source 309 is turned on and the current source 319 is turned off, the NMOS transistors 315 and 317 and the current source 319 would be considered as 'no presence' at the point.

Considering the current source 701 is a constant current source, the sum of the currents flowing through the NMOS transistor 305 and the PMOS transistor 703 is equal to the current flowing through the current source 701. Hence, when the conduction current of the NMOS transistor 305 is increased, the conduction current of the PMOS transistor 703 would be decreased and the voltage of the output signal OUTB would be accordingly decreased; when the conduction current of the NMOS transistor 305 is decreased, the conduction current of the PMOS transistor 703 would be increased and the voltage of the output signal OUTB would be accordingly increased. Similarly, considering the current source 711 is a constant current source, the sum of the currents flowing through the NMOS transistor 307 and the PMOS transistor 713 is equal to the current flowing through the current source 711. Hence, when the conduction current of the NMOS transistor 307 is increased, the conduction current of the PMOS transistor 713 would be decreased and the voltage of the output signal OUTA would be accordingly decreased; when the conduction current of the NMOS transistor 307 is decreased, the conduction current of the PMOS transistor 713 would be increased and the voltage of the output signal OUTA would be accordingly increased.

Since the conduction currents of the NMOS transistors 305 and 307 are respectively controlled by the input signals INA1 and INB1 of the first input pair, and the conduction currents of the NMOS transistors 315 and 317 are respectively controlled by the input signals INA2 and INB2 of the second input pair, hence, the input signals of the differential amplifier can be switched by the control signals CS1 and CS2, and the output signals OUTA and OUTB are accordingly varied therewith.

Figure 8:
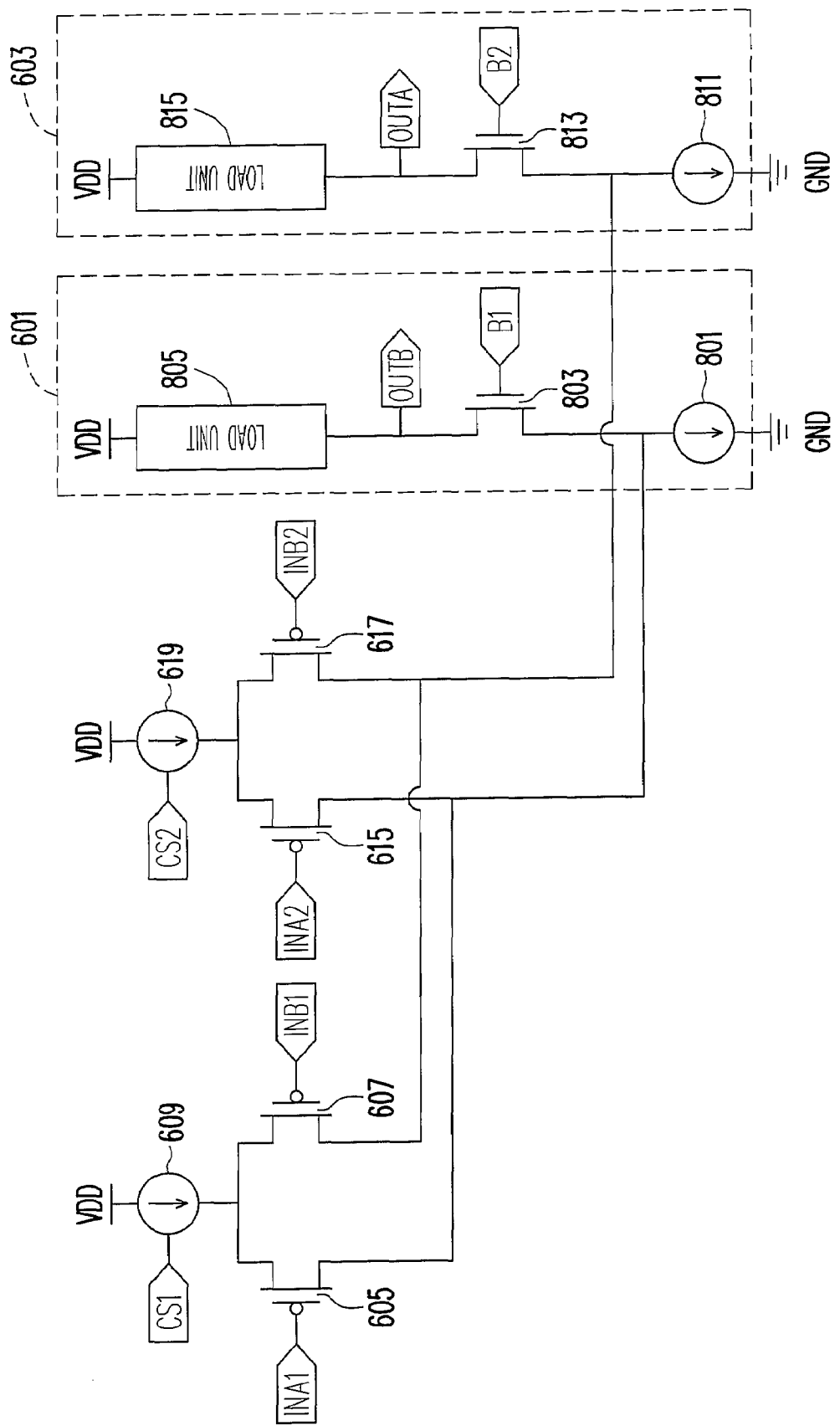
FIG. 8 is a circuit diagram of a folded cascade differential amplifier with a plurality of input pairs where PMOS transistors are used as input terminals according to an embodiment of the present invention.

Although the above embodiment employs NMOS transistors as the inputs terminals for a differential amplifier, and in another embodiment PMOS transistors incorporated with an appropriately adjusted circuit can be employed as the input terminals for a differential amplifier as well. FIG. 8 is a circuit diagram of a folded cascade differential amplifier with a plurality of input pairs where PMOS transistors are used as input terminals according to an embodiment of the present invention. Referring to FIG. 8, this embodiment is similar to that shown by FIG. 6 except for a current source 801, NMOS transistor 803 and a load unit 805 are employed to replace the load unit 601 of FIG. 6, and a current source 811, an NMOS transistor 813 and a load unit 815 are employed to replace the load unit 603 of FIG. 6, wherein the gate terminals of the NMOS transistors 783 and 813 respectively receive an input voltage bias B1 and an input voltage bias B2, and the input voltage biases B1 and B2 serve as switches to control on/off states of the transistors. If the current source 609 is turned on and the current source 619 is turned off, the PMOS transistors 615 and 617 and the current source 619 would be considered as 'no presence'.

Considering the current source 801 is a constant current source, the sum of the currents flowing through the PMOS transistor 605 and the NMOS transistor 803 is equal to the current flowing through the current source 801. Hence, when the conduction current of the PMOS transistor 605 is increased, the conduction current of the NMOS transistor 803 would be relatively decreased and the voltage of the output signal OUTB would be accordingly increased; when the conduction current of the PMOS transistor 605 is decreased, the conduction current of the NMOS transistor 803 would be relatively increased and the voltage of the output signal OUTB would be accordingly decreased. Similarly, considering the current source 811 is a constant current source, the sum of the currents flowing through the PMOS transistor 607 and the NMOS transistor 813 is equal to the current flowing through the current source 811. Hence, when the conduction current of the PMOS transistor 607 is increased, the conduction current of the NMOS transistor 813 would be relatively decreased and the voltage of the output signal OUTA would be accordingly increased; when the conduction current of the PMOS transistor 607 is decreased, the conduction current of the NMOS transistor 813 would be relatively increased and the voltage of the output signal OUTA would be accordingly decreased.

Since the conduction currents of the PMOS transistors 605 and 607 are respectively controlled by the input signals INA1 and INB1 of the first input pair, and the conduction currents of the PMOS transistors 615 and 617 are respectively controlled by the input signals INA2 and INB2 of the second input pair, hence, the input signals of the differential amplifier can be switched by the control signals CS1 and CS2, and the output signals OUTA and OUTB are accordingly varied therewith.

Figure 9:
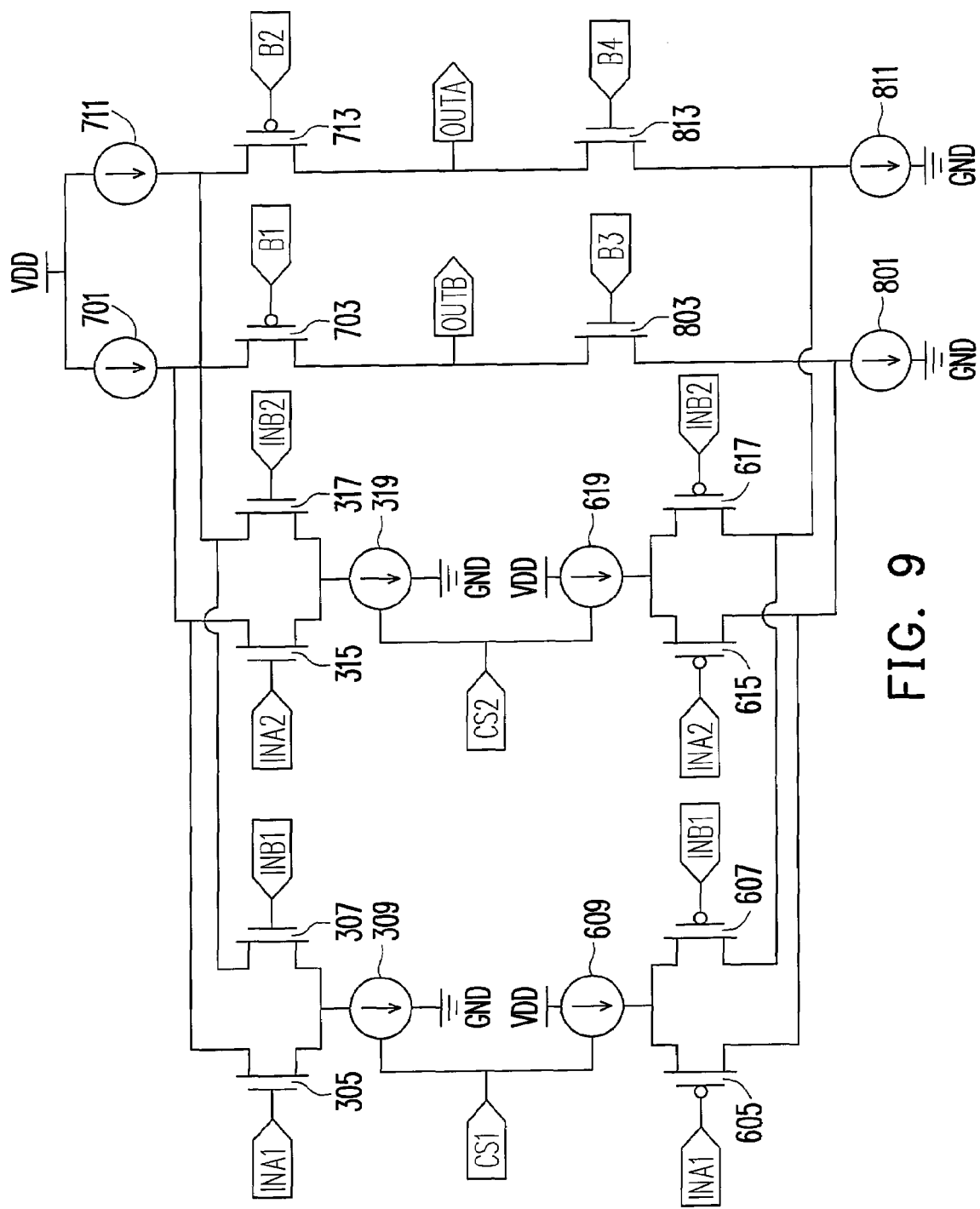
FIG. 9 is a circuit diagram of a differential amplifier with a plurality of dual input pairs according to an embodiment of the present invention.

In another embodiment, the circuits shown in FIGS. 7 and 8 in the above-mentioned embodiments may be combined by adjusting the circuits. For example, FIG. 9 is a circuit diagram of a differential amplifier with a plurality of dual input pairs according to an embodiment of the present invention. Referring to FIG. 9, in the embodiment, NMOS transistors 305, 307, 315 and 317, PMOS transistors 703 and 713 and current sources 309, 319, 701 and 711 are similar to those of FIG. 7, while PMOS transistors 605, 607, 615 and 617, NMOS transistors 803 and 813 and current sources 609, 619, 801 and 811 are similar to those of FIG. 8. Anyone skilled in the art would be able to easily derive the application and the operation principle thereof from the above disclosure of the present invention, and they are construed to be within the scope of the present invention. It should be noted that the control signal CS1 simultaneously controls on/off states of the current sources 309 and 609, and the control signal CS2 simultaneously controls on/off states of the current sources 319 and 619.

When the current sources 309 and 609 are turned on and the current sources 319 and 619 are turned off, the NMOS transistors 315 and 317, the PMOS transistors 615 and 617 and the current sources 319 and 619 are considered as 'no presence'. At this time, the input signals of the differential amplifier are the first set of input signals INA1 and INB1, wherein the input signals INA1 and INB1 are respectively input to the gates of the NMOS transistors 305 and 307 and the PMOS transistors 605 and 607. Similarly, when the current sources 319 and 619 are turned on and the current sources 309 and 609 are turned off, the NMOS transistors 305 and 307, the PMOS transistors 605 and 607 and the current sources 309 and 609 are considered as 'no presence'. At this time, the input signals of the differential amplifier are the second set of input signals INA2 and INB2, wherein the input signals INA2 and INB2 are respectively input to the gates of the NMOS transistors 315 and 317 and the PMOS transistors 615 and 617, so as to form a differential amplifier with a plurality of input pairs.

Figure 10A:
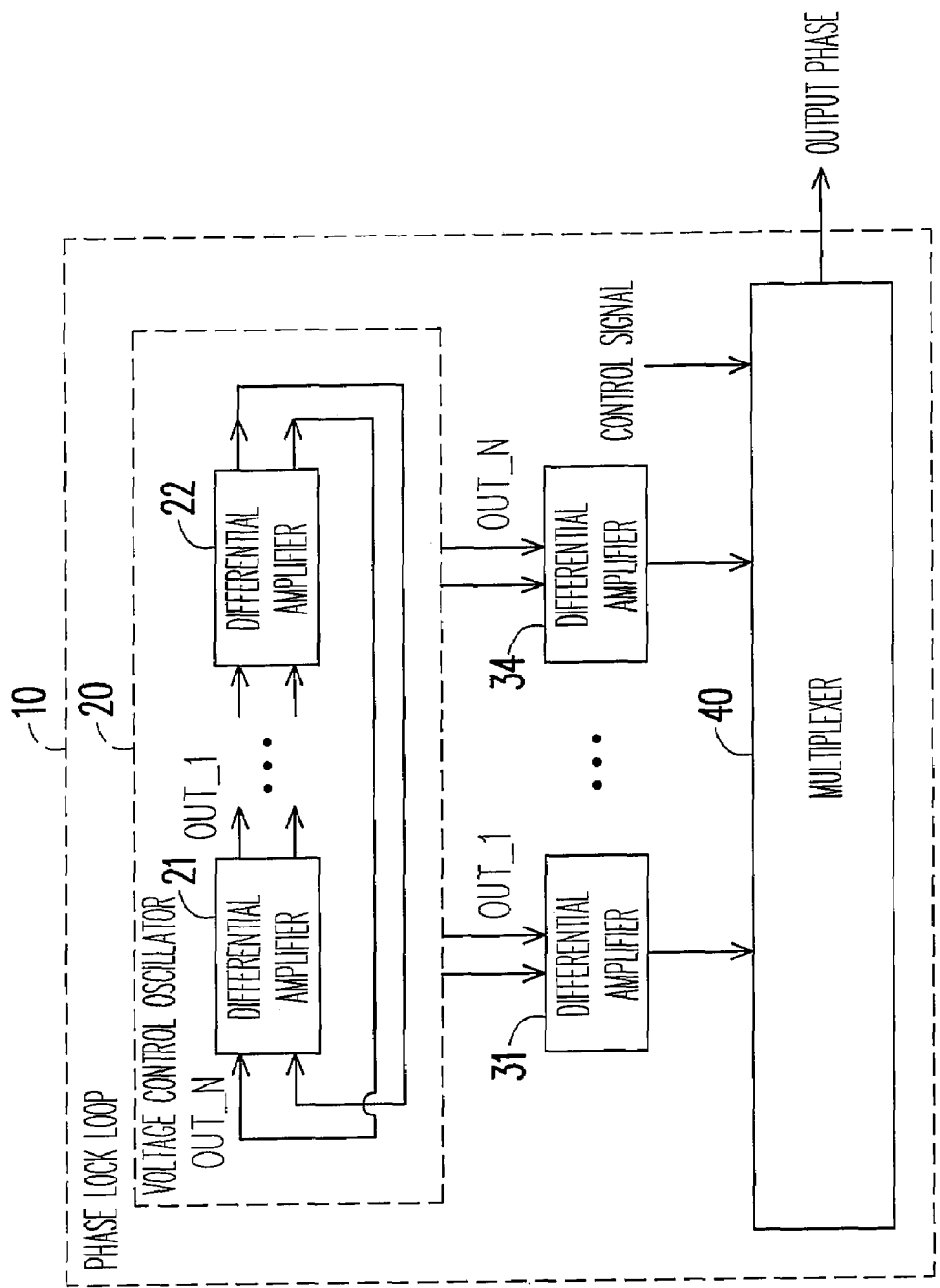
FIG. 10A is a circuit diagram of a conventional PLL capable of switching output phases.
Figure 10B:
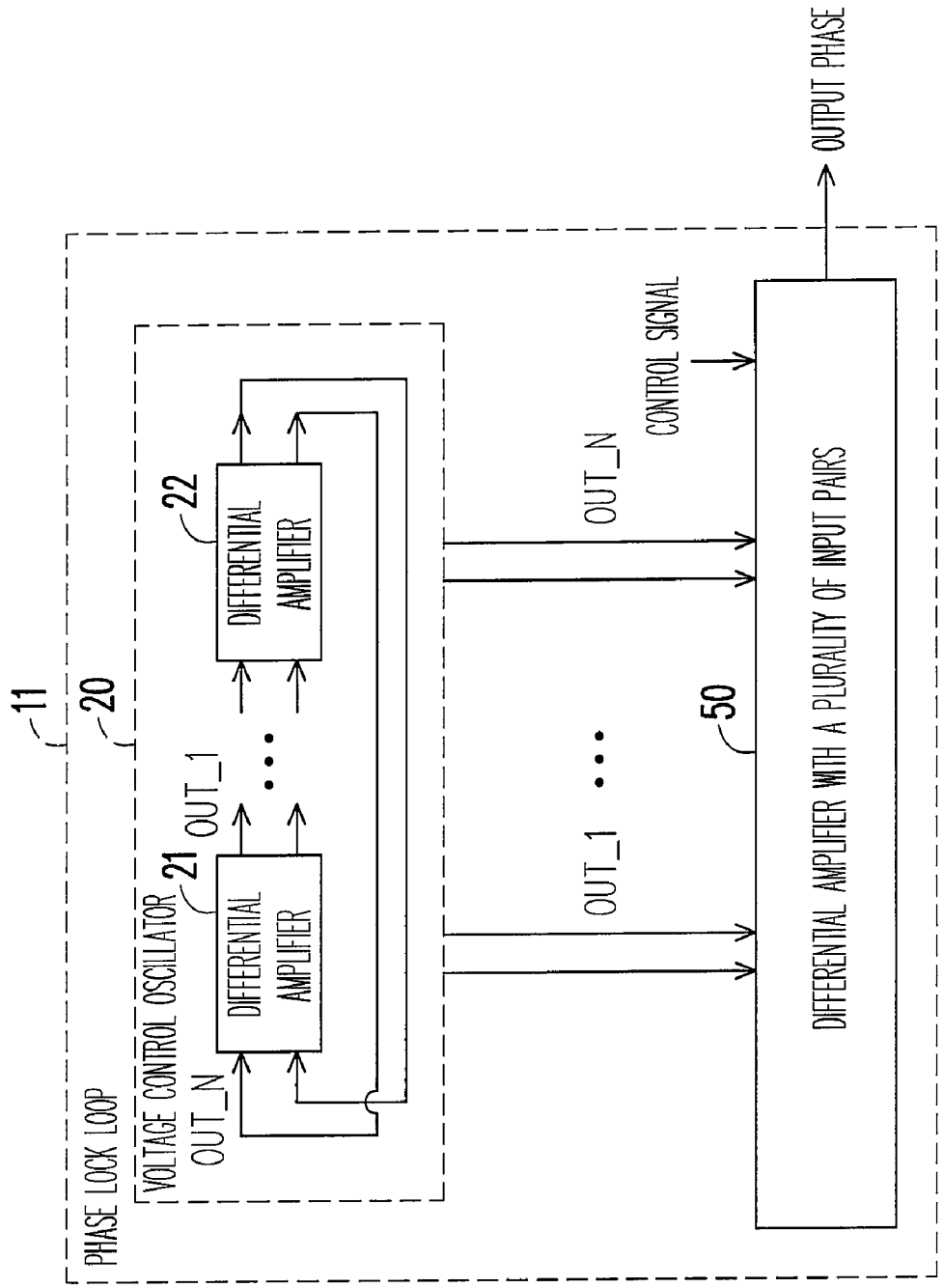
FIG. 10B is a circuit diagram of a PLL capable of switching output phases according to an embodiment of the present invention.

Anyone skilled in the art would be able to apply the above-mentioned differential amplifier in a phase lock loop (PLL) to meet the need thereof according to the present invention. For example, FIG. 10A is a circuit diagram of a conventional PLL capable of switching output phases and FIG. 10B is a circuit diagram of a PLL capable of switching output phases according to an embodiment of the present invention. Referring to FIG. 10A, a conventional PLL 10 generates output signals OUT_1-OUT_N which are equally distributed over 360° phase angle by using the differential amplifiers 21 and 22 of a voltage controlled oscillator (VCO) 20, followed by outputting the multiphase signals to a multiplexer 40 via differential amplifiers 31-34. Then, the multiplexer 40 selects one of the input signals as the phase output of the PLL 10 by means of a control signal. However referring to FIG. 10B, in the present embodiment, a PLL 11 is able to achieve the function of switching the multiphase signals of the PLL 11 by using a VCO 20 and a differential amplifier with a plurality of input pairs similar to that of FIG. 3D. Compared to FIG. 10A, the layout of FIG. 10B not only saves a plurality of differential amplifiers, but also saves the multiplexer 40 and substantially reduces the cost.

In summary, the present invention adopts a differential amplifier with a plurality of input pairs, which not only includes a differential amplifier with a single input pair, but also a pair of transistors and a current source to provide the input signals of an additional input pair, wherein the pair of transistors and the differential amplifier with a single input pair share a same load unit so as to switch the input signals of the multi input pairs by controlling on/off states of the current sources. In this way, the present invention improves the quality and thereby resolves the problem caused by a high-frequency switch. In the present invention, an additional ESD and switches are saved so as to reduce the cost. Furthermore, the present invention saves a load unit, which would further reduce the cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A differential amplifier with a plurality of input pairs, comprising:

a first load unit, comprising a first terminal and a second terminal, wherein the first terminal of the first load unit is coupled to a first voltage;

a second load unit, comprising a first terminal and a second terminal, wherein the first terminal of the second load unit is coupled to a second voltage;

a first transistor, comprising a gate, a first source/drain and a second source/drain, wherein the gate of the first transistor is coupled to a first voltage bias of a first input pair and the first source/drain of the first transistor is coupled to the second terminal of the first load unit;

a second transistor, comprising a gate, a first source/drain and a second source/drain, wherein the gate of the second transistor is coupled to a second voltage bias of the first input pair and the first source/drain of the second transistor is coupled to the second terminal of the second load unit;

a first current source, comprising a first terminal and a second terminal, wherein the first terminal of the first current source is coupled to the second source/drain of the first transistor and the second terminal of the first current source is coupled to a third voltage;

a third transistor, comprising a gate, a first source/drain and a second source/drain, wherein the gate of the third transistor is coupled to a first voltage bias of a second input pair and the first source/drain of the third transistor is coupled to the second tenninal of the first load unit;

a fourth transistor, comprising a gate, a first source/drain and a second source/drain, wherein the gate of the fourth transistor is coupled to a second voltage bias of the second input pair and the first source/drain of the fourth transistor is coupled to the second terminal of the second load unit; and a second current source, comprising a first terminal and a second terminal, wherein the first terminal of the second current source is coupled to the second source/drain of the third transistor and the second source/drain of the fourth transistor, and the second terminal of the second current source is coupled to a fourth voltage;

wherein the differential amplifier determines on/off state of the first current source according to a first control signal and determines on/off state of the second current source according to a second control signal, so as to switch the input pairs by turning on one of the first current source and the second current source.

2. The differential amplifier according to claim 1, further comprises:

a first switch, disposed on the first terminal or the second terminal of the first current source, wherein the first switch determines whether the first terminal or the second terminal of the first current source is allowed to be coupled to outside according to the first control signal so as to control on/off state of the first current source; and a second switch, disposed on the first terminal or the second terminal of the second current source, wherein the second switch determines whether the first terminal or the second terminal of the second current source is allowed to be coupled to outside according to the second control signal so as to control on/off state of the second current source.

3. The differential amplifier according to claim 1, wherein the first transistor is an NMOS transistor, the second transistor is an NMOS transistor, the third transistor is an NMOS transistor and the fourth transistor is an NMOS transistor.

4. The differential amplifier according to claim 3, wherein the first load unit further comprises:

a third current source, comprising a first terminal and a second terminal, wherein the first terminal of the third current source is coupled to the first voltage;

a first PMOS transistor, wherein a gate terminal of the first PMOS transistor is coupled to a first operation voltage bias and a source terminal of the first PMOS transistor is coupled to the second terminal of the third current source; and a third load unit, comprising a first terminal and a second terminal, wherein a first terminal of the third load unit is coupled to the drain terminal of the first PMOS transistor and a second terminal of the third load unit is coupled to a fifth voltage;

wherein the first terminal of the third current source serves as the first terminal of the first load unit, and the second terminal of the third current source serves as the second terminal of the first load unit.

5. The differential amplifier according to claim 4, wherein the second load unit further comprises:

a fourth current source, comprising a first terminal and a second terminal, wherein a first terminal of the fourth current source is coupled to the second voltage;

a second PMOS transistor, wherein the gate terminal of the second PMOS transistor is coupled to a second operation voltage bias and the source terminal of the second PMOS transistor is coupled to the second terminal of the fourth current source; and a fourth load unit, comprising a first terminal and a second terminal, wherein a first terminal of the fourth load unit is coupled to the drain terminal of the second PMOS transistor and the second terminal of the fourth load unit is coupled to a sixth voltage;

wherein the first terminal of the fourth current source serves as the first terminal of the second load unit, the second terminal of the fourth current source serves as the second terminal of the second load unit, the first terminal of the fourth load unit serves as a first output terminal of the differential amplifier and the first terminal of the third load unit serves as a second output terminal of the differential amplifier so as to form a folded cascode differential amplifier.

6. The differential amplifier according to claim 5, wherein the first voltage is the operation voltage, the second voltage is the operation voltage, the third voltage is coupled to the grounded terminal, the fourth voltage is coupled to the grounded terminal, the fifth voltage is coupled to the grounded terminal and the sixth voltage is coupled to the grounded terminal.

7. The differential amplifier according to claim 1, wherein the first transistor is a PMOS transistor, the second transistor is a PMOS transistor, the third transistor is a PMOS transistor and the fourth transistor is a PMOS transistor.

8. The differential amplifier according to claim 7, wherein the first load unit further comprises:

a third current source, comprising a first terminal and a second terminal, wherein the first terminal of the third current source is coupled to the first voltage;

a first NMOS transistor, wherein a gate terminal of the first NMOS transistor is coupled to a first operation voltage bias and a source terminal of the first NMOS transistor is coupled to the second terminal of the third current source; and a third load unit, comprising a first terminal and a second terminal, wherein a first terminal of the third load unit is coupled to a drain terminal of the first NMOS transistor and the second terminal of the third load unit is coupled to a fifth voltage;

wherein the first terminal of the third current source serves as the first terminal of the first load unit, and the second terminal of the third current source serves as the second terminal of the first load unit.

9. The differential amplifier according to claim 8, wherein the second load unit further comprises:

a fourth current source, comprising a first terminal and a second terminal, wherein the first terminal of the fourth current source is coupled to the second voltage;

a second NMOS transistor, wherein a gate terminal of the second NMOS transistor is coupled to a second operation voltage bias, a source terminal of the second NMOS transistor is coupled to the second terminal of the fourth current source and a source terminal of the second NMOS transistor serves as the second terminal of the second load unit; and a fourth load unit, comprising a first terminal and a second terminal, wherein the first terminal of the fourth load unit is coupled to the drain terminal of the second NMOS transistor and the second terminal of the fourth load unit is coupled to a sixth voltage;

wherein the first terminal of the fourth current source serves as the first terminal of the second load unit, the second terminal of the fourth current source serves as the second terminal of the second load unit, the first terminal of the fourth load unit serves as a first output terminal of the differential amplifier and the first terminal of the third load unit serves as a second output terminal of the differential amplifier so as to form a folded cascode differential amplifier.

10. The differential amplifier according to claim 9, wherein the first voltage is the grounded terminal voltage, the second voltage is the grounded terminal voltage, the third voltage is the operation voltage, the fourth voltage is the operation voltage, the fifth voltage is the operation voltage and the sixth voltage is the operation voltage.

* * * * *